(12) United States Patent
Liu

(10) Patent No.: US 6,318,688 B1
(45) Date of Patent: Nov. 20, 2001

(54) BRACKET

(75) Inventor: Yao-Tser Liu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/429,765

(22) Filed: Oct. 28, 1999

(30) Foreign Application Priority Data

Jun. 8, 1999 (TW) .............................................. 88209353 U

(51) Int. Cl.[7] .................................................. A47B 96/06
(52) U.S. Cl. ...................................... 248/221.11; 248/694
(58) Field of Search ........................ 248/346.03, 221.12, 248/222.11, 222.13, 222.12, 694; 361/690, 752; 174/16.1

(56) References Cited

U.S. PATENT DOCUMENTS

| 4,500,943 | * | 2/1985 | Greene | 361/383 |
|---|---|---|---|---|
| 4,536,904 | * | 8/1985 | Whitehead | 248/221.3 |
| 5,442,520 | * | 8/1995 | Kemp et al. | 361/785 |
| 5,467,254 | * | 11/1995 | Brusati et al. | 361/799 |
| 5,486,681 | * | 1/1996 | Dagnac et al. | 361/690 |
| 5,653,412 | * | 8/1997 | Martorano et al. | 248/222.11 |
| 5,931,426 | * | 8/1999 | Heckner | 248/220.21 |
| 6,002,586 | * | 12/1999 | Chen et al. | 361/683 |

* cited by examiner

*Primary Examiner*—Anita King
*Assistant Examiner*—Gwendolyn Baxter
(74) *Attorney, Agent, or Firm*—Wei Te Chung

(57) ABSTRACT

A bracket for mounting a circuit board includes a body and a rib. The body including a top plate, a bottom plate and a side plate connected between the top and the bottom plates. A top latch and a bottom latch respectively extend from the top and the bottom plates. The rib is retained between the top and the bottom plates of the body. A top aperture and a bottom aperture are defined in the rib for respectively engagingly receiving the top and the bottom latches of the body therein to attach the rib to the body thereby reinforcing the body.

2 Claims, 6 Drawing Sheets

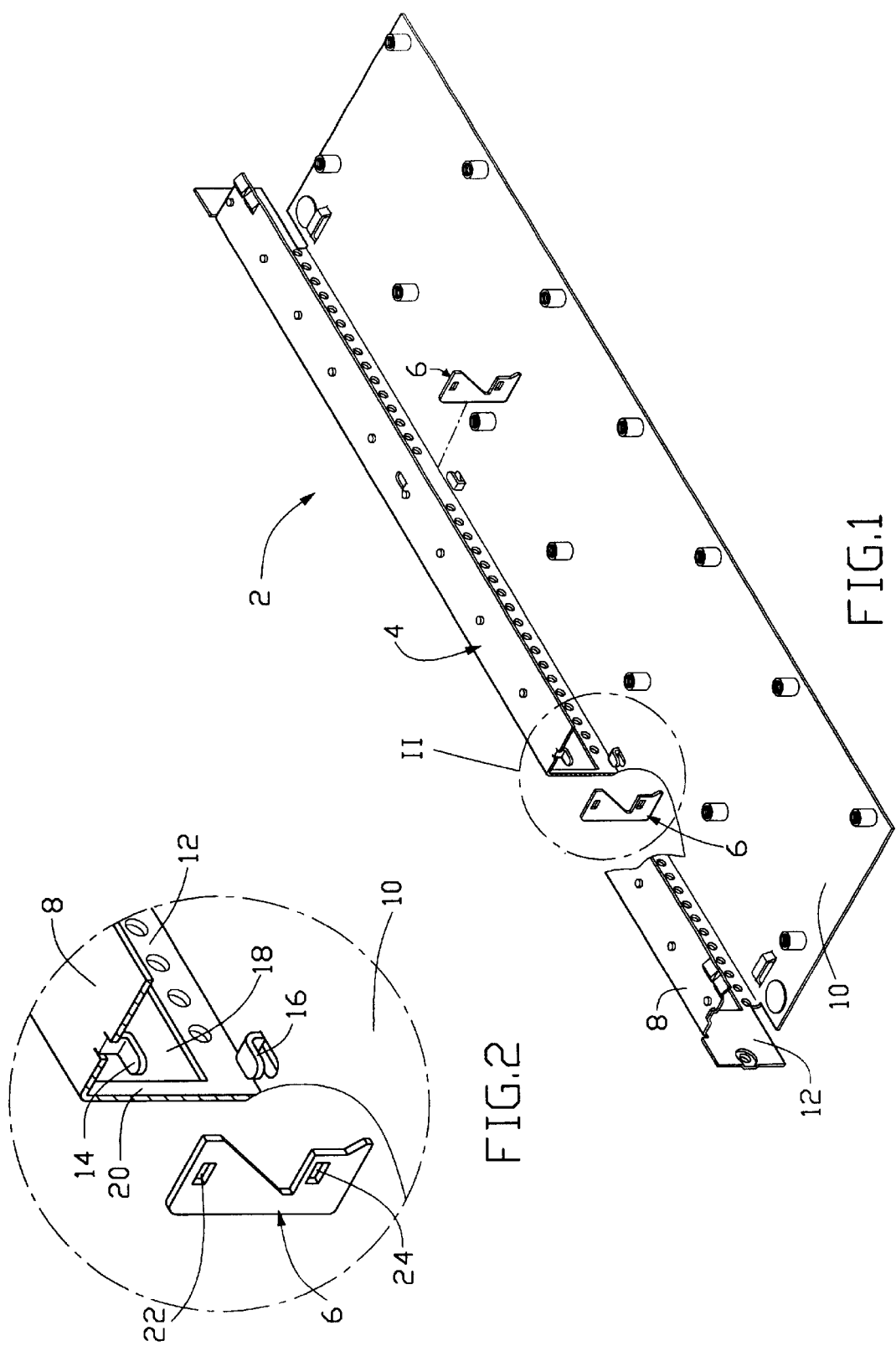

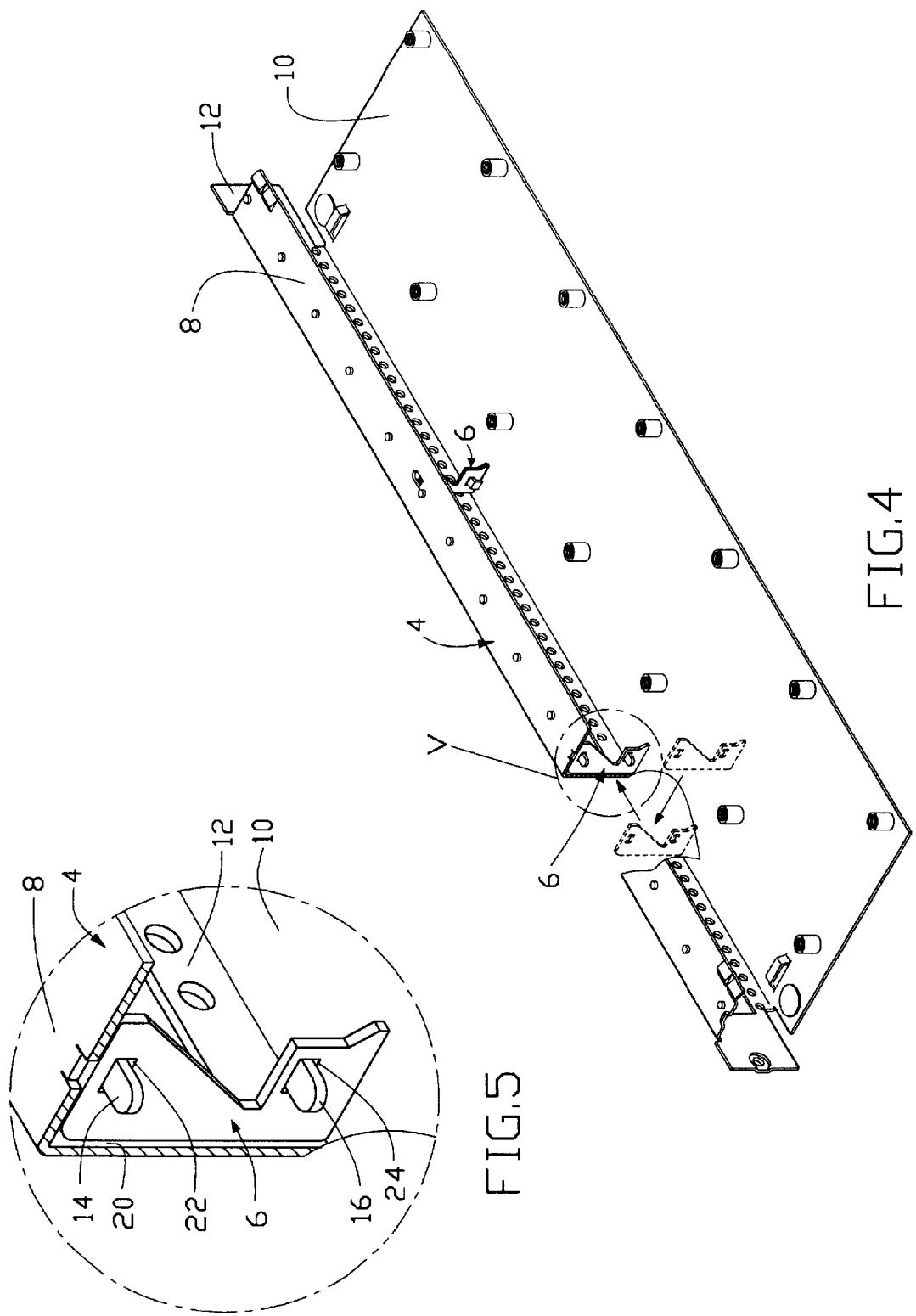

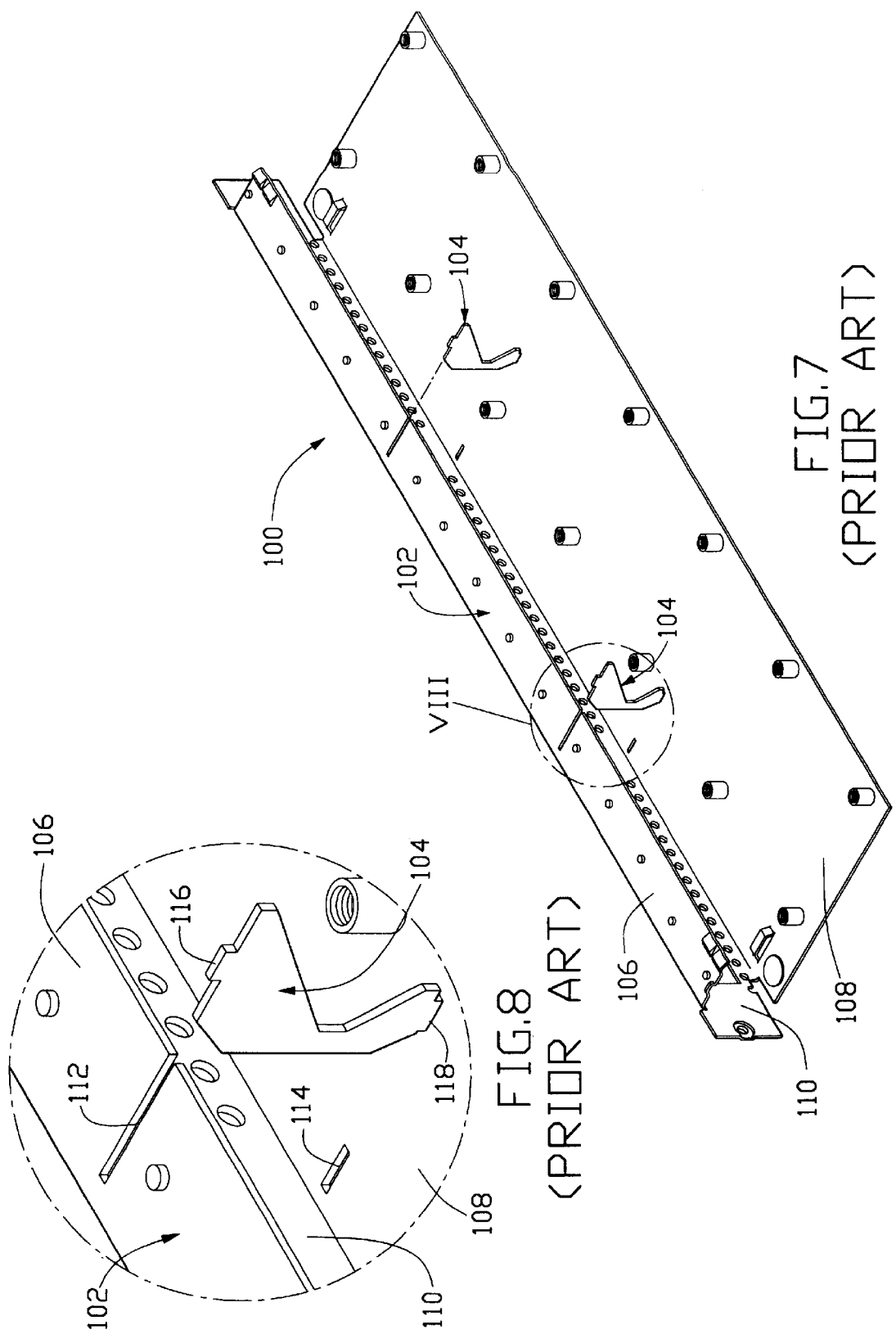

BRACKET

BACKGROUND OF THE INVENTION

1. Field of the Invention

The present invention relates to a bracket for mounting a circuit board, and particularly to a bracket incorporating a rib for reinforcing the bracket.

2. The Related Art

A circuit board is mounted on a bracket and assembled to a signal exchanging device. Referring to FIGS. 7–9, a conventional bracket 100 includes a body 102 and a plurality of ribs 104 (only one being visible) connected to the body 102 for reinforcing the bracket 100. The body 102 includes a top plate 106, a bottom plate 108 and a side plate 110 connecting the top and bottom plates 106, 108. The top plate 106 defines a plurality of slots 112. A plurality of apertures 114 is defined in the bottom plate 108. Each rib 104 forms a top protrusion 116 and a bottom protrusion 118 for respectively extending into the slot 112 and the aperture 114 of the body 102 by flexing the top plate 106. The rib 104 is soldered and thus fixed to the body 102.

However, since the top and bottom protrusions 116, 118 of the ribs 104 are inserted into the slot 112 and aperture 114 of the body 102 by flexing the top plate 106, the operation is complicated. Furthermore, since the rib 104 is fixed to the body 102 by soldering, the operation is further complicated and time consuming.

Thus, it is desired to have a rib which is easily connected to a body of a bracket for overcoming the above problems.

SUMMARY OF THE INVENTION

An object of the present invention is to provide a bracket comprising a rib which is easily connected to the bracket.

To fulfil the object mentioned above, a bracket in accordance with the present invention comprises a body and a rib. The body including a top plate, a bottom plate and a side plate connected between the top and the bottom plates. A top latch and a bottom latch respectively extend from the top and the bottom plates. The rib is retained between the top and the bottom plates of the body. A top aperture and a bottom aperture are defined in the rib for respectively engagingly receiving the top and the bottom latches of the body therein to attach the rib to the body.

Other objects and advantages of the present invention will be understood from the following description of a preferred embodiment thereof with reference to the accompanying drawings, wherein:

BRIEF DESCRIPTION OF THE DRAWINGS

FIG. 1 is a perspective view, partially broken, of a bracket of the present invention;

FIG. 2 is an enlarged view of the encircled portion II of FIG. 1;

FIG. 4 is a partially assembled view of FIG. 1;

FIG. 5 is an enlarged view of the encircled portion V of FIG. 4;

FIG. 7 is an exploded view of a conventional bracket;

FIG. 8 is an enlarged view of the encircled portion VIII of FIG. 7; and

DETAILED DESCRIPTION OF THE PREFERRED EMBODIMENT

Figure 3:
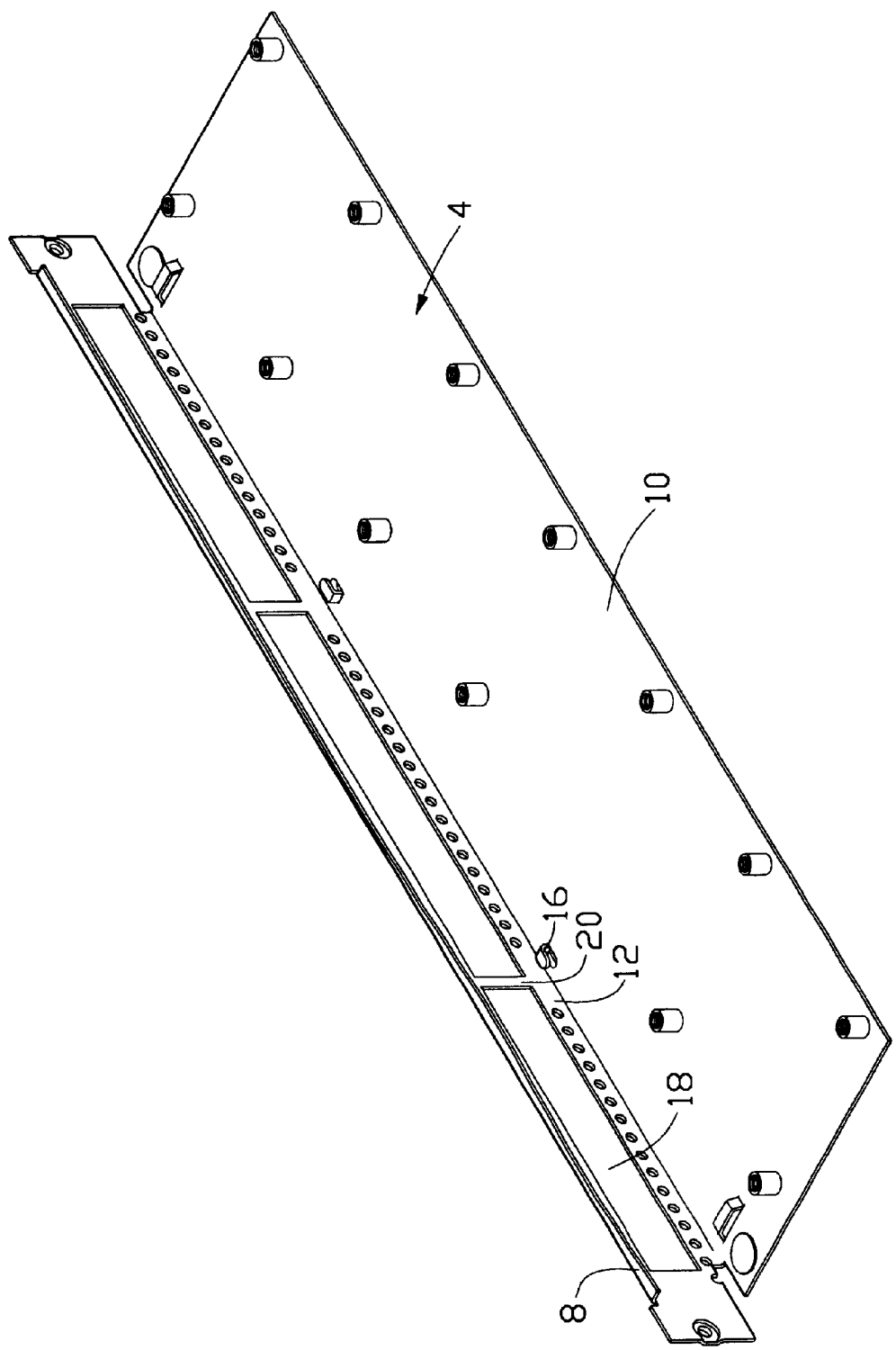
FIG. 3 is a prospective view of a body of the bracket in accordance with the present invention.

Referring to FIGS. 1–3, a bracket 2 in accordance with the present invention includes a body 4 and a pair of ribs 6 (only one being visible) attached to the body 4. The body 4 includes a top plate 8, a bottom plate 10 and a side plate 12 connecting the top and bottom plates 8, 10. The top plate 8 forms a pair of top latches 14 extending from an inner surface thereof. A pair of bottom latches 16 extends from an inner surface of the bottom plate 10 and is aligned with the top latches 14. Three openings 18 are defined in the side plate 12 with a pair of partitions 20 formed between the openings 18.

Each rib 6 defines a top aperture 22 and a bottom aperture 24 for respectively receiving the top and bottom latches 14, 16 of the body 4 whereby the ribs 6 are securely attached to the body 4.

Figure 6:
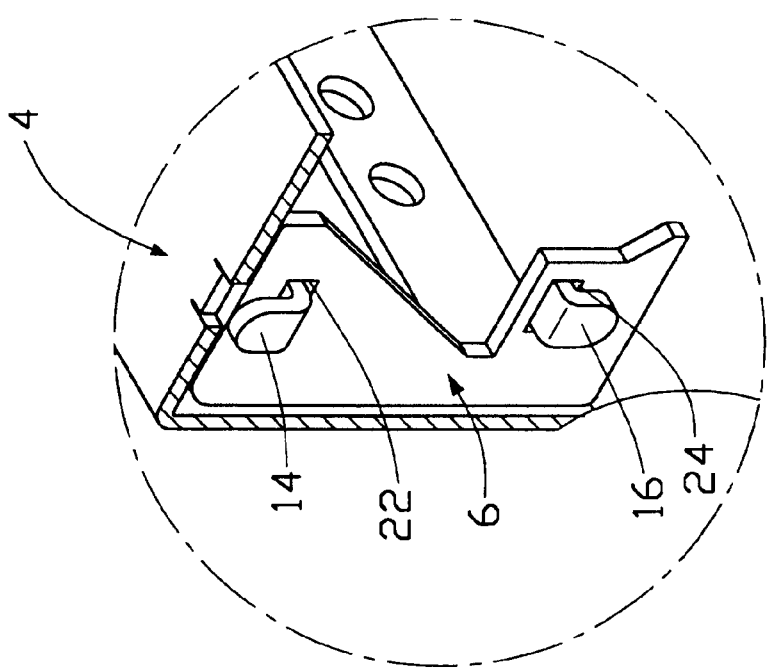
FIG. 6 is similar to FIG. 5 but showing an assembled view of FIG. 1.
Figure 9:
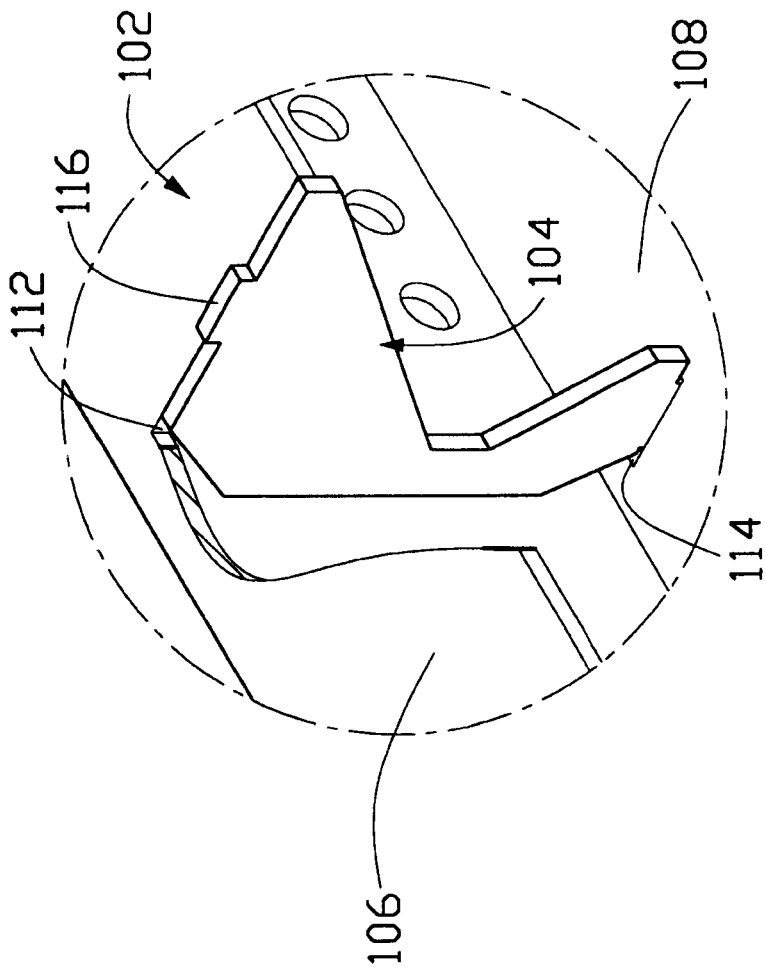
FIG. 9 is similar to FIG. 8 but showing an assembled view of FIG. 7.

Referring to FIGS. 4–6, to assemble, each rib 6 is positioned between the top and bottom plates 8, 10 and receives the top and bottom latches 14, 16 respectively in the top and bottom apertures 22, 24 thereof. The rib 6 abuts against the inner surfaces of the top and bottom plates 8, 10 and the partition 20 of the side plate 12 thereby strengthening the body 4. Free ends of the top and bottom latches 14, 16 of the top and bottom plates 8, 10 are bent to engage with the rib 6 thereby securely fastening the rib 6 to the body 4. Thus, it is easy to assemble the ribs 6 to the body 4.

It will be understood that the present invention may be embodied in other forms without departing from the spirit thereof. The present example and embodiment, therefore, is to be considered in all respects as illustrative and not restrictive, and the invention is not to be limited to the details given herein.

What is claimed is:

1. A bracket for use within a computer, comprising:

a body including a top plate, a bottom plate, and a side plate defining a plurality of openings and a respective partition between every adjacent two openings for connecting the top plate to the bottom plate, a top latch and a bottom latch being respectively formed on the top plate and the bottom plate proximate to each partition, the side plate extending along a lengthwise direction; and a rib received within a space defined among the top plate, the bottom plate and the side plate, said rib defining a top aperture and a bottom aperture for latchable engagement with the top latch and the bottom latch, respectively; wherein said rib is fixedly mounted to the top and bottom latches in the lengthwise direction of said side plate.

2. The bracket as claimed in claim 1, wherein at least one of said top and said bottom latches defines an L-shaped configuration having a horizontal portion, parallel to the top plate and the bottom plate, extending through a corresponding aperture, and a vertical portion abutting against a surface of the rib so that the rib is retained in position with regard to the body.

* * * * *